United States Patent [19]

Lapin et al.

[11] Patent Number: 5,506,087

[45] Date of Patent: Apr. 9, 1996

[54] STEREOLITHOGRAPHY USING VINYL ETHER BASED POLYMERS

[75] Inventors: Stephen C. Lapin, Wauconda, Ill.; Richard J. Brautigam, Westfield, N.J.

[73] Assignee: AlliedSignal Inc., Morris Township, Morris County, N.J.

[21] Appl. No.: 231,353

[22] Filed: Apr. 20, 1994

Related U.S. Application Data

[63] Continuation of Ser. No. 661,766, Feb. 27, 1991, abandoned.

[51] Int. Cl.$^6$ ............................................. G03C 5/00
[52] U.S. Cl. ........................ 264/401; 430/284.1; 430/269; 522/170
[58] Field of Search ........................... 430/269, 284; 522/170; 264/22

[56] References Cited

U.S. PATENT DOCUMENTS

| | | | |
|---|---|---|---|
| 4,575,330 | 3/1986 | Hull | 425/174.4 |
| 4,749,807 | 6/1988 | Lapin | 522/108 |
| 4,751,273 | 6/1988 | Lapin | 522/96 |
| 4,844,144 | 7/1989 | Murphy et al. | 164/35 |
| 4,942,001 | 7/1990 | Murphy et al. | 264/22 |
| 4,956,198 | 9/1990 | Shama et al. | 427/54.1 |
| 4,996,282 | 2/1991 | Noren | 528/75 |
| 5,004,842 | 4/1991 | Klemarczyk | 526/313 |
| 5,019,636 | 5/1991 | Lapin | 522/97 |
| 5,139,872 | 8/1992 | Lapin | 522/90 |
| 5,437,964 | 8/1995 | Lapin et al. | 430/280 |

FOREIGN PATENT DOCUMENTS

| | | |
|---|---|---|
| 0360869 | 2/1989 | European Pat. Off. . |
| 2355794 | 1/1978 | France . |
| WO89/08021 | 9/1989 | WIPO . |
| WO90/01512 | 2/1990 | WIPO . |
| WO90/03989 | 4/1990 | WIPO . |

OTHER PUBLICATIONS

Lapin "Vinyl Ether Termianted Ester Monomers . . . ". Rad Tech '90 North Am. Conf. Proceedings, vol. 1, pp. 410–416. 1990.

*Primary Examiner*—Mark Chapman
*Attorney, Agent, or Firm*—Harold N. Wells; Roger H. Criss

[57] ABSTRACT

Polymer precursor formulations suitable for stereolithography may be prepared from compositions containing (a) a vinyl ether oligomer, and (b) mono and/or multifunctional vinyl ether monomers.

36 Claims, No Drawings

STEREOLITHOGRAPHY USING VINYL ETHER BASED POLYMERS

This application is a continuation of application Ser. No. 07/661,766 filed Feb. 27, 1991 now abandoned.

PRIOR ART

This invention relates to the art of stereolithography, which is a technique for forming solid shapes from a liquid polymer precursor. More particularly, the invention relates to improvements in such polymer precursors.

Stereolithography is described in U.S. Pat. No. 4,576,330 to Hull. The method involves building up a predetermined three-dimensional shape by forming a series of layers of polymerized solids. A cross-section of the solid is traced out on the surface of a bath of polymer precursors under the direction of a computer controlled system which causes the liquid to be exposed to a form of radiation such as an ultraviolet laser. After each polymerized layer is formed, it is lowered in the bath so that a new layer can be formed on top. Hull does not discuss in detail the type of polymer precursors which may be used, confining his discussion to the equipment used in the stereolithographic process. He states that the curable liquid (i.e., the polymer precursor) should cure fast enough to allow practical object formation times, should be self-adherent, should have a relatively low viscosity, should absorb UV light, should be soluble when not polymerized but insoluble when polymerized, and should be non-toxic. Hull suggests that acrylate formulations may be used and subsequent publications show that acrylate compositions have been preferred heretofore.

In WO 89/08021 and U.S. Pat. No. 4,942,001 DeSoto, Inc. disclose the use of a formulation which combines both acrylates and methacrylates. Their polymer precursor solution is comprised of resinous polyacrylates and polymethacrylates dissolved in liquid polyacrylates and polymethacrylates. They state that if both the liquid and resinous materials are polymethacrylates they cure too slowly, while if both are polyacrylates they cause distortion of the solid product. Consequently, they use one type as the resinous material and the other as the liquid. They suggest that in practice an N-vinyl monomer is included to increase the curing speed and by using the liquid polyacrylates or polymethacrylates distortion is reduced. They prefer the use of a resinous polyacrylate with a liquid polymethacrylate. The polyacrylate resins preferred are polyurethane diacrylates, particularly those which have a polyester base. The preferred N-vinyl monomer is N-vinyl pyrrolidone.

Another disclosure of interest is U.S. Pat. No. 4,844,144, also assigned to DeSoto Inc., which involves dispersing a thermoplastic material in the liquid polymer precursor so that the solid formed by stereolithography contains the thermoplastic material. Such a solid polymer is said to be useful in the investment casting process since the thermoplastic material prevents the acrylate polymer from expanding when the solid is burned out of a mold. The acrylates and methacrylates used as polymer precursors are closely related to those disclosed in WO89/08021 discussed above.

Acrylates are not entirely satisfactory for use in stereolithography. They are not as non-toxic as one would be like and they are not cured as rapidly and completely as would be desired. Post-curing of the solids formed by stereolithography is necessary and it is difficult to obtain rapid and complete curing of acrylates by exposure to intense UV light or exposure to elevated temperatures.

The present inventors have found that it is possible to employ polymer precursors based on vinyl ether compounds which have significant advantages over the acrylate-based formulations used heretofore in stereolithography.

Vinyl ethers have been mentioned in previous publications relating to stereolithography.

A vinyl ether urethane was disclosed in Example 6 of French Patent 2,355,794. It was combined with a diacrylate and cured by exposure to an electron beam. There was no suggestion in this 1977 patent that such mixtures could be used in stereolithography, since it apparently preceded the development of that technology.

The use of vinyl ethers in stereolithography was suggested in WO 90/01512, but in combination with maleates or fumarates and in the presence of specific types of photoinitiators.

In U.S. Pat. No. 4,956,198 assigned to DeSoto, Inc. coatings intended for use in optical glass fibers were said to have application to stereolithography as well. Such coatings included vinyl ether terminated polyurethane produced from certain diisocyanates reacting with polyols and then capping with monohydroxyl vinyl ethers.

In WO 90/03989 DeSoto, Inc. addressed the use of vinyl ethers in stereolithography using a transvinylation reaction product to react with a diisocyanate to prepare urethane oligomers. The transvinylation reaction converted a polyhydric alcohol into a mixture of products having one or more of the hydroxyl groups in the alcohol converted to a vinyl ether group. The mixture was thereafter reacted with a diisocyanate via the residual hydroxyl groups to produce a vinyl ether urethane.

SUMMARY OF THE INVENTION

Broadly, the invention comprises compositions suitable for stereolithography, such compositions comprising (a) vinyl ether oligomers of urethanes, phenols, polyesters, polyethers, and polysiloxanes and (b) mono and/or multi-functional vinyl ether monomers derived from aliphatic or aromatic hydrocarbons, esters, ethers, and siloxanes.

The vinyl ether oligomers may be generally described as

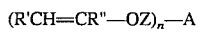
(R'CH=CR"—OZ)$_n$—A where

R' and R" are H or alkyl groups with 1–10 carbon atoms

A is a moiety derived from urethanes, phenols, polyesters, polyethers, and polysiloxanes and has a molecular weight of about 400 to 10,000

Z is a moiety derived from a saturated aliphatic or cycloaliphatic hydrocarbon or an alkylene ether and has molecular weight of about 28 to 250 n is an integer from 2 to 6, preferably 3 or more.

The vinyl ether monomers may be generally described by the formula

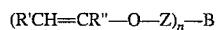
(R'CH=CR"—O—Z)$_n$—B where

R' and R" are as defined above

Z is as defined above n is an integer from 1 to 4

B is a moiety derived from aromatic and aliphatic hydrocarbons, esters, siloxanes, and ethers and has a molecular weight of about 60 to 400.

Monofunctional monomers are those which have n=1, while the multifunctional monomers are those which have n=2 to 4.

More particularly, the compositions may include (a) about 20 to 85 wt. % of the vinyl ether oligomers, (b) about 15 to 80 wt. % of the multifunctional vinyl ether monomers and up to about 40 wt. % of the monofunctional vinyl ether monomers, plus about 0.1 to 5 wt. % of a cationic photoinitiator.

In one aspect the invention is a process for forming three-dimensional objects by exposing a bath of the above compositions to repeated exposure to actinic light, such as ultraviolet or visible light from a laser.

DESCRIPTION OF THE PREFERRED EMBODIMENTS

Compositions of the invention comprise a) vinyl ether oligomers of urethanes, phenols, polyesters, polyethers and polysiloxanes, and b) multifunctional and/or monofunctional vinyl ether monomers derived from aliphatic or aromatic hydrocarbons, esters, ethers, and siloxanes.

VINYL ETHER OLIGOMERS

The vinyl ether oligomers may be generally described as

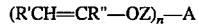
$(R'CH=CR''-OZ)_n-A$ where
- R' and R'' are H or an alkyl group having 1 to 10 carbon atoms
- A is a moiety derived from urethanes, phenols, polyesters, polyethers, or polysiloxanes and has a molecular weight of about 400 to 10,000
- Z is a moiety derived from a saturated aliphatic or cycloaliphatic hydrocarbon or a polyalkylene ether and has a molecular weight of about 28 to 250
- n is an integer from 2 to 6, preferably 3 or more.

Such oligomers are described in detail below.

Vinyl Ether Urethane Oligomers

Where A is derived from a urethane the vinyl ether urethane oligomer may be obtained by reacting
(i) a hydroxyl-terminated polyester having the formula

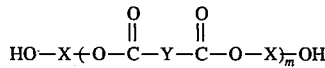

$$HO-X+O-\overset{O}{\underset{\|}{C}}-Y-\overset{O}{\underset{\|}{C}}-O-X\bigg)_{\overline{m}}OH$$

where
- X and Y are divalent radicals having a molecular weight of about 28 to 500 and selected from the group consisting of alkylene, arylene, aralkylene, and cycloalkylene radicals
- m has an average value of about 1 to 100 and
(ii) a diisocyanate having the formula

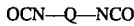
OCN—Q—NCO where Q is a divalent radical selected from the group consisting of alkylene, arylene, aralkylene, and cycloalkylene radicals
or a polyisocyanate having a functionality greater than 2 and (iii) a hydroxy monovinyl ether having the formula

R'CH=CR''O—Z—OH where
- R' and R'' are mono valent radicals selected from the group consisting of H and alkyl groups having 1–10 carbon atoms
- Z is a divalent radical having a molecular weight of about 28 to 250 and selected from the group consisting of alkylene, cycloalkylene, or polyalkylene ether radicals.

In an alternative embodiment, the vinyl ether urethane oligomer may be one in which the polyester of (i) is replaced entirely or in part by a hydroxy-terminated polyether having the general formula

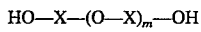
$HO-X-(O-X)_m-OH$ where m and x are as defined for the polyester of (i).

The moieties X and Y may be alkylene groups, especially those containing up to about 20 carbon atoms, a cycloalkylene group, an arylene, or aralkylene group. Examples of the alkylene moieties which may be used include ethylene, propylene, butylene, pentylene, hexylene, heptylene, octylene, nonylene, decylene, undecylene, dodecylene, tridecylene, tetradecylene, pentadecylene, hexadecylene, heptadecylene, octa-decylene, nonadecylene, and eicosylene. Examples of arylene groups include phenylene, naphthylene, anthrylene, phenanthrylene, etc. Cycloalkylene groups include the cyclopentylene, cyclohexylene, cycloheptylene, cyclooctylene, and cycloalkylene groups containing 1 or more alkyl groups on the nucleus. Similarly, the arylene groups which may be used for Y also may contain one or more alkyl groups on the aromatic ring, especially where such alkyl groups contain up to about 6 carbon atoms. Examples of aralkylene groups include benzylene, 1-phenethylene, 2-phenethylene, 3-phenylpropylene, 2-phenylpropylene, 1-phenylpropylene, etc. Particularly useful Y groups are —$(CH_2)_n$— groups where n is 2, 3, or 4; 1,2, 1,3, or 1,4 phenylene groups; and 1,4 cyclohexylene groups. Particularly useful X groups are —$CH_2CH_2$—; —$CH_2CH_2$—O—$CH_2CH_2$—; —$CH_2$—$(CH_3)CH$—; —$(CH_2)_n$— where n is 4 or 6; —$CH_2$—$(CH_3)_2C$—$CH_2$—; 1,4 phenylene; and 1,4-bis (methyl) phenylene.

m will be an integer from 1 to about 100, preferably from 1 to 10.

Particularly preferred hydroxyl-terminated polyesters include poly(propylene adipate), poly(neopentyl adipate), poly(1,4-butane adipate), poly(1,6-hexane adipate), poly-(neopentyl isophthalate), and poly(1,6-hexane isophthalate). Polyesters derived from mixed polyols or acids may be useful. Particularly important are polyesters in which triols such as trimethylol propane or glycerol are incorporated into the polyester to produce a polyester with a functionality >2. The preferred molecular weights for the polyesters will be about 500 to 5000.

In the alternative embodiment where polyethers are used, X preferably will be —$CH_2CH_2$—, —$CH_2(CH_3)CH$—, and —$CH_2CH_2CH_2CH_2$—. The molecular weight preferably will be about 250 to 5,000. Mixed polyethers may also be used, for example, those derived from a polyol, such as ethoxylated or propoxylated trimethylol propane.

A broad variety of diisocyanates may be used and may be exemplified by such materials as the toluene diisocyanates (TDI), p- and m-phenylene diisocyanate, 1,4-tetramethylene diisocyanate, 1,6-hexamethylene diisocyanate, 2,2,4-trimethylhexamethylene diisocyanate, 1,4-cyclohexane diisocyanate, 4,4'-di-cyclohexylmethane diisocyanate (Desmodur W), 4,4'-diphenylmethane diisocyanate (MDI), 3,3'-dimethyl-4,4-diphenylmethane diisocyanate, 1,5-tetrahydronaphthalene diisocyanate, naphthalene-1,5'-diisocyanate, bis(2-methyl-3-isocyanatephenyl)methane, 4,4'-diphenylpropane diisocyanate, tetramethylxylene diisocyanate (TMXDI), isophorone diisocyanate (IPDI).

Polyisocyanates with a functionality of 2 or more such as are described and discussed in U.S. Pat. No. 4,433,067, especially the polyisocyanates based on methylenediphenyl diisocyanate, especially the 4,4'-isomer and the uretonimine modified MDI as described there, also may be utilized. The term polyisocyanate also includes quasi prepolymers of polyisocyanates with active hydrogen containing materials where the polyisocyanate is typically reacted with from about 0.05 to about 0.3 equivalents of a polyol. Although a vast number of polyisocyanates are suitable, in practice polyisocyanates based on MDI and TDI may be preferred for economy and general availability.

Among the most desirable isocyanates may be mentioned 4,4'-diphenylmethane diisocyanate, toluene diisocyanate, isophorone diisocyanate, m-tetramethylxylene diisocyanate, 4,4'-dicyclohexylmethane diisocyanate (Desmodur W), and 1,6-hexamethylene diisocyanate.

The vinyl ether terminated alcohols which are used in preparing the oligomeric esters have a structure corresponding to the adduct of an alkyne and a diol. However, these vinyl ether terminated alcohols also can be made in other ways, and the method of producing them is not part of this invention. Reference may be made to RE 33,211 for a discussion of the reaction of acetylene with a diol. The resulting hydroxy monovinyl ether may be purified or in many cases the reaction mixture, which includes divinyl ether and residual diol may be used directly. The alkyne has the generic formula R'C≡CR", and the diol has the generic formula HO—Z—OH. The generic formula of the vinyl ether terminated alcohols of our invention is

R'CH=CR"O—ZOH.

The groups R' and R" are independently selected from the group consisting of hydrogen and lower alkyl moieties containing from 1 to 10 carbon atoms, although those with from 1 to about 4 carbon atoms are favored. It is preferable that both R' and R" are not alkyl moieties, for in the case where both are lower alkyl groups this causes an undesirable reduction in polymerization rate of the oligomers of our invention. Where R' is an alkyl moiety it is preferred that R" be hydrogen, and conversely; where R' is hydrogen then R" should be an alkyl of 1 to 4 carbons. In a preferred embodiment R' or R" is a methyl group and R" and R' is hydrogen. In a still more preferred embodiment both R' and R" are hydrogen.

Z will be a divalent radical having a molecular weight of 28 to about 250 and selected from the group consisting of alkylene, cycloalkylene, or polyalkylene ether radicals. In one preferred embodiment, Z is ethylene, butylene, or dimethylene cyclohexane radicals.

Among the diols one important class consists of alkylene glycols, HO($C_nH_{2n}$)OH, where n is an integer from 2 to about 10. The linear alkylene glycols, HO($CH_2$)$_n$OH, (polymethylenediols), where n is an integer from 2 to about 10, are particularly useful, especially where n is from 2 to about 6. Illustrative of the members of this group are such diols as ethylene glycol, 1,3-propylene glycol, 1,4-butanediol, 1,5-pentanediol, 1,6-hexanediol, 1,7-heptanediol, 1,8-octanediol, 1,9-nonanediol, and 1,10-decanediol (decamethylene glycol).

The nonlinear or branched alkylene diols also may be used, where such glycols contain from 3 up to about 10 carbon atoms. Examples include 1,2-propylene glycol, 2,3-butanediol, 2,3-dimethyl-2-3-butanediol, 2,3-dimethyl-1,4-butanediol, 2,2-dimethyl-1,3-propanediol(neopentylglycol).

Another useful class of diols are the polyalkylene glycols, especially poly(ethylene) glycols, HO[—$CH_2CH_2O$—]$_m$OH, and poly(propylene) glycol, HO[—$CH(CH_3)CH_2O$—]$_m$OH, where m is an integer from 1 up through about 50, although more usually m is an integer from 1 up to about 10, and most preferably from 1 up to about 5. Examples of these glycols include diethylene glycol, triethylene glycol, tetraethylene glycol, pentaethylene glycol, hexaethylene glycol, etc., along with the analogs of the propylene glycols.

Of particular importance is the case where Z is a divalent radical whose parent is a cycloalkane, such as cyclopentane, cyclohexane, cycloheptane, or cyclooctane, preferably the bishydroxy alkyl derivatives. The preferred diols are the 1,3-bis(hydroxyalkyl)cyclopentanes and the 1,4-bis(hydroxyalkyl)cyclohexanes, -cycloheptanes, and -cyclooctanes, particularly the cyclohexanes. Diols substituted at positions different from those specified above may be used in the practice of this invention, but not necessarily with equivalent results. The bis(hydroxymethyl)cyclohexanes are preferred as they are readily available from the reduction of the corresponding phthalic acids, and among these 1,4-bis(hydroxymethyl)cyclohexane is favored.

Of the hydroxy monovinyl ethers which are produced by the reaction of acetylene with the diols described above, those which are especially preferred include 4-hydroxybutyl vinyl ether, 4-hydroxymethyl cyclohexylmethyl vinyl ether, 2-hydroxy ethyl vinyl ether, triethylene glycol monovinyl ether, and diethylene glycol monovinyl ether. In addition to the pure hydroxymonovinyl ether, mixtures containing the corresponding divinyl ether R'HC=CR"—O—Z—O—R"C=CHR' and/or the parent diol HO—Z—OH may also be used.

An important characteristic of the vinyl ether terminated urethane oligomers is that in all cases there are few hydroxyl groups derived from the polyester, polyether or hydroxy monovinyl ether in the final product. That is, less than about 10% of the initial hydroxyl groups remain unreacted. It is most preferable that the oligomeric vinyl ether terminated product contain no detectable free hydroxyl groups, i.e., less than about 1% of the initial hydroxyl groups of the reactant mixture remain unreacted. It is also important that there should be essentially no free isocyanate groups remaining in the product, that is, less than about 1% of the initial isocyanate groups of the reactant mixture. In general, the ratios of polyester (a), diisocyanate (b) and monovinyl ether (c) are selected to provide an equal number of equivalents of hydroxyl and isocyanate groups.

The vinyl ether urethane oligomers may be formed by reacting the hydroxyl-terminated polyester (a) with the isocyanate compound (b) or by reacting the isocyanate (b) with the hydroxy vinyl ether (c) and thereafter reacting the adduct with the remaining component or alternatively, the three components may be co-reacted. The ratios of (a), (b), and (c) will be chosen so that the ratio of the total number of hydroxyl groups from (a) and (c) to the number of isocyanate groups from (b) is about 1:1. The ratio of the number of hydroxyl groups from (a) to the number of hydroxyl groups from (c) should be in the range from about 0.5 to 5. The reaction may be carried out at temperatures in the range of 0° to 150° C. Solvents such as diethyl ether, methylene chloride, or toluene may be employed and later removed from the oligomers, or the components may be reacted in the absence of solvents. Divinyl ether monomers such as 1,4-cyclohexane dimethanol divinyl ether or triethylene glycol divinyl ether may also be used as solvents. Such compounds may be obtained as by-products in the preparation of hydroxy monovinyl ethers. Since they have no free hydroxyl groups they do not react with the isocyanates, but may remain with the oligomers and become included in the formulations used for stereolithography.

The reaction may be carried out without a catalyst, but a tin containing catalyst such as dibutyl tin dilaurate may be used.

Vinyl Ether Polyester Oligomers

Where A is derived from a polyester, they will typically include those described in my U.S. Pat. Nos. 4,749,807 and 4,845,265. They may be considered the product obtained by reacting (a) a dicarboxylic acid having the formula

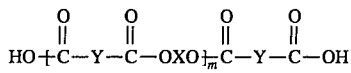

where X, Y, and m are defined above with respect to vinyl ether urethane oligomers (b) with a hydroxy monovinyl ether having the formula

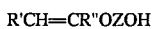

where R', R" and Z are defined above with respect to vinyl ether urethane oligomers.

Vinyl Ether Polysiloxanes

Where A is derived from a polysiloxane, they will typically include those described in U.S. Pat. No. 4,617,238, in which a polysiloxane having Si—H groups is reacted by hydrosilation with a vinyl ether containing a second C=C group not directly bonded to an oxygen atom. The vinyl ether polysiloxanes may be defined as $(R'CH=CR'—O—Z—O—)_n—A'$ where R', R", and Z are as defined above.

n is an integer from 2 to 8

A' is a polysiloxane having n Si—H groups and a molecular weight of 140 to 5,000.

The polysiloxane may be linear, cyclic, or a combination of both types and may be substituted with aliphatic or aromatic moieties. Preferred substituents on the Si atoms are methyl and phenyl groups.

Vinyl Ether Phenolics

Where A is derived from a phenol, they will typically include those described in U.S. Pat. No. 4,518,788, and may be defined as

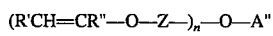

A' is a polyvalent aromatic radical having a molecular weight of about 152 to 5,000

R', R" and Z are as defined above n is 2 to 6.

In one preferred embodiment Z is ethylene and A' is derived from 4',4'-isopropylidene diphenol (i.e. bisphenol A).

Vinyl Ether Polyethers

Where A is derived from a polyether they may be obtained by reacting poly(ethylene oxy), poly(propylene oxy) or poly(butyleneoxy) glycols, i.e. , HO—[—CH$_2$CH$_2$O]$_m$—H, HO—[—CH(CH$_3$)CH$_2$O]$_m$—H, or HO—[—(CH$_2$)$_4$O]$_m$—H, respectively, where m has an average value from 2 to 50 with acetylene or a vinyloxy alkyl halide, for example, 2-chloroethyl vinyl ether.

VINYL ETHER MONOMERS

The structure of the vinyl ether monomers may be similar to those of the oligomers described above but the monomers will have lower molecular weights. When their viscosity is low, they are useful as reactive diluents in the stereolithography formulations.

The vinyl ether monomers may be generally described by the formula

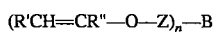

where

R' and R" are as defined above

Z is as defined above n is an integer from 1 to 4

B is derived from aromatic and aliphatic hydrocarbons, esters, ethers, and siloxanes and has a molecular weight of about 60 to 400.

Monofunctional monomers are those which have n=1, while the multifunctional monomers are those which have n=2 to 4.

Vinyl Ether Monomers from Esters

Vinyl ether terminated ester monomers may be described by the formula

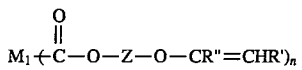

where n is 1 to 4,

M$_1$ is a mono, di, tri, or tetra functional radical having a molecular weight of 15 to 180 and selected from the group consisting of alkylene, arylene, aralkylene and cycloalkylene radicals, Z is a divalent radical having a molecular weight of 28 to 290 and selected from the group consisting of alkylene, cycloalkylene, or polyalkylene ether radicals, R' and R" are monovalent radicals selected from the group consisting of H and alkyl groups having 1–10 carbon atoms.

In one preferred embodiment M$_1$ is a mono, di, tri, or tetra functional radical of benzene. In another embodiment, M$_1$ is alkylene with 2–4 carbon atoms and Z is the α,α' diradical derived from 1,4-dimethylcyclohexane.

Vinyl Ether Monomers From Ethers

Vinyl ether terminated ether monomers are related to the polyether oligomers described above but the molecular weight is much lower, i e., "m" is only about 1 to 5.

Vinyl Ether Monomers From Aliphatic Hydrocarbons

Vinyl ether terminated aliphatic monomers may be described by the formula

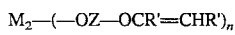

where n is 1 to 4

$M_2$ is a mono, di, tri, or tetra functional aliphatic or cycloaliphatic radical having a molecular weight of about 56 to 500

Z is a divalent radical as defined above

R' and R" are monovalent radicals as defined above.

Vinyl Ether Monomers From Aromatic Hydrocarbons

Vinyl ether terminated aromatic monomers may be described by the formula

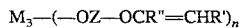

where n is 1 to 4

$M_3$ is a mono, di, tri, or tetrafunctional aromatic radical having a molecular weight of about 77 to 500

Z is a divalent radical as defined above

R' and R" are monovalent radicals as defined above.

Formulation of Polymer Precursors

The compositions may include a) about 20 to 85 wt. % of the vinyl ether oligomers, b) about 15 to 80 wt. % of the multifunctional vinyl ether monomers and up to 40 wt. % of the monofunctional vinyl ether monomers, plus about 0.1 to 5 wt. % of a cationic photoinitiator.

A cationic photoinitiator is used to cause the vinyl ethers to react and produce the desired polymer. The recognized classes of cationic photoinitiators include various compounds which respond to irradiation by producing acid species capable of catalyzing cationic polymerization. See Crivello, *Advances in Polymer Science*, 62, p. 1–48 (1984). Onium salts of Group V, VI, and VII elements are stated to be the most efficient and versatile of the cationic photoinitiators. They generate strong Lewis acids which can promote cationic polymerization. Curing of the vinyl ether compositions of the invention is not limited to a particular class of such photoinitiators, although certain types are preferred, including onium salts based on halogens and sulfur. More specifically, the onium salt photoinitiators described in Crivello's U.S. Pat. No. 4,058,400 and in particular iodonium and sulfonium salts of $BF_4^-$, $PF_6^-$, $SbF_6^-$, and $SO_3CF_3^-$. Preferred photoinitiators are triarylsulfonium hexaflorophosphate salts, and diaryliodonium hexafluoroantimony salts. They are usually required in amounts from about 0.1 to 5% in the blended formula of vinyl ethers. Preferred initiators include:

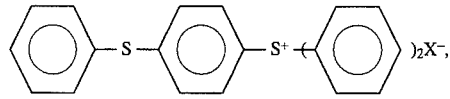

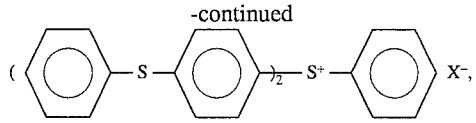

and

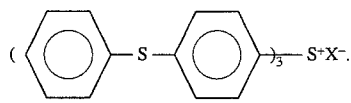

where X is $SbF_6^-$ or $PF_6^-$.

Commercially available initiators include UVI-6974 (an $SbF_6^-$ salt) and UVI-6990 (a $PF_6^-$ salt) supplied by Union Carbide. Other cationic photoinitiators are defined by the formulas

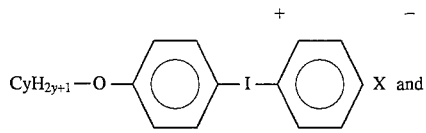

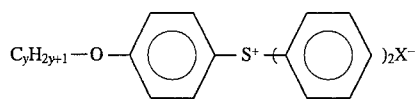

where y is 1 to 18.

In addition to the principal ingredients discussed above, the formulations may also contain dyes, stabilizers, fillers, pigments, and antioxidants such as hindered phenols, wetting agents such as fluorosurfactants e.g. FC-430 from 3-M, photosensitizers such as benzophenone, thioxanthone, perylene and other components familiar to those skilled in the art.

Stereolithography

The vinyl ether formulations of this invention may be polymerized by exposure to known sources of energy such as electron beams, ultraviolet light, high temperatures, and the like. In stereolithographic applications, the polymer formulation forms a liquid bath in which the precursors are polymerized in successive layers, typically by repeated exposure to actinic light, particularly a UV or visible laser beam, such as ultraviolet light from helium/cadmium laser or an argon ion laser or visible light from an argon ion laser. After the three-dimensional shape has been formed, it is removed from the bath, washed as necessary, and cured further by thermal means or supplemented by ultraviolet or visible light means if desired.

The vinyl ether formulations of the invention have several advantages over the acrylate-based formulations of the art. In particular, the vinyl ethers can be post-cured by heating and do not require the use of UV light for post-curing, which is required for acrylate formulations, since they cannot be thermally post-cured, without the use of a thermal initiator which undesirably reduces pot life of the acrylate formulation.

EXAMPLE 1

A vinyl ether terminated urethane oligomer was prepared by reacting polypropylene adipate ($M_n$=500, Witco Formrez 33-225, 1.0 hydroxy equivalent) with modified MDI (BASF MP-102, 2.0 NCO equivalents) and 4-hydroxymethyl cyclohexyl methyl vinyl ether (CHMVE) (1.0 hydroxy equivalent). The reaction was carried out in combination with 10% 1,4-cyclohexane dimethanol divinyl ether (CHVE). The product was a clear thick liquid resin.

EXAMPLE 2

A stereolithographic formulation was formulated as shown below:

| Component | Parts by Weight |
| --- | --- |
| Product from Example 1 | 45 |
| HBVE-isophthalate[a] | 15 |
| CHVE[b] | 40 |
| $Ar_3SSbF_6$ (Union Carbide UVI-6974) | 0.5 |

[a] the reaction product of isophthalic acid and 4-hydroxy butyl vinyl ether (HBVE)
[b] 1,4-cyclohexane dimethanol divinyl ether (CHVE)

EXAMPLE 3

The formulation of Example 2 was irradiated in a 3D Systems model SLA250 stereolithography apparatus which employs a He/Cd laser at 325 nm. The thickness of the polymer was measured at various UV exposures. Similar measurements were made using a commercially available acrylate based stereolithography resin (Ciba-Geigy XB5081). The photospeed of the acrylate formulation determined from the X intercept of a plot of cure depth versus radiation dose was found to be 4.7 mj/cm$^2$ while the vinyl ether formulation of the invention was significantly faster, 2.0 mj/cm$^2$.

EXAMPLE 4

A stereolithographic formulation was prepared as shown below:

| Component | Parts by Weight |
| --- | --- |
| Product from Example 1 | 55 |
| HBVE-isophthalate | 25 |
| HBVE-succinate[a] | 20 |
| $Ar_3SSbF_6$ (Union Carbide UVI-6974) | 0.35 |

[a] The reaction product of succinic acid with 4-hydroxy butyl vinyl ether.

This formulation has a viscosity of 4,500 cps at 35° C.

EXAMPLE 5

The formulation from Example 4 was used in a 3D Systems model SLA250 to make a series of test parts. The results are shown in the Table. An acrylate based formulation is also shown for comparison.

| Property | Example Formulation | Acrylate Formulation (Ciba XB 5081) |
| --- | --- | --- |
| Shrinkage, cured film (%) | 7.7 | 8.9 |
| Curl Distortion | 1.5 | 1.3 |
| Gel Dose (mj/cm$^2$) | 20 | 4.7 |
| Modulus after Laser cure (psi) | 28,000 | 13,000 |
| Modulus after post cure (psi) | 44,000 | 430,000 |
| Elongation after post cure (%) | 50 | 3 |

The relatively small change in modulus for the vinyl ether formulation indicated that most of the curing was complete upon laser irradiation. This is highly desirable compared to the acrylate which shows a large change in modulus upon post cure. The results also show that the cured vinyl ether is flexible while the cured acrylate is quite brittle. Flexibility is important for facilitating manipulation of the prototype parts.

EXAMPLE 6

The formulation from Example 4 was used to fabricate a prototype model of a turbine fan blade. The resulting part had good accuracy and good mechanical properties.

We claim:

1. In a process for forming a three-dimensional object from a liquid polymer precursor comprising repeatedly exposing the surface of a bath of said precursor to a beam of actinic light to solidify successive layers of said precursor the improvement comprising employing as said liquid polymer precursor a mixture of (a) at least one vinyl ether oligomer having the formula $(R'CH=CR''-OZ)_n-A$ where R' and R" are H or an alkyl group having 1 to 10 carbon atoms A is a moiety from at least one of the group consisting of urethanes, phenols, polyesters, polyethers, and polysiloxanes and has a molecular weight of about 400 to 10,000

Z is a moiety from a saturated aliphatic or cyclo aliphatic hydrocarbon or a polyalkylene ether and has a molecular weight of about 28 to 250 n is an integer from 2 to 6;

(b) at least one vinyl ether monomer having the formula $(R'CH=CR''-O-Z)_n-B$ where R' and R" are H or an alkyl group having 1 to 10 carbon atoms Z is a moiety from a saturated aliphatic or cyclo aliphatic hydrocarbon or a poly alkylene ether and has a molecular weight of about 28 to 250 n is an integer from 1 to 4

B is from at least one of the group consisting of aliphatic and aromatic hydrocarbons, esters, and ethers and has a molecular weight of about 60 to 400;

and (c) a cationic photoinitiator.

2. The process of claim 1 wherein for (a) R' and R" are hydrogen.

3. The process of claim 1 wherein for (a) R' is methyl and R" is hydrogen.

4. The process of claim 1 wherein for (b) R' and R" are hydrogen.

5. The process of claim 1 wherein for (b) R' is methyl and R" is hydrogen.

6. The process of claim 1 wherein the liquid polymer precursor comprises 20–85 wt. % of the vinyl ether oligomers of (a) and 15–80 wt. % of the multifunctional vinyl ether monomers of (b) and up to 40 wt. % is the monofunctional monomers of (b) plus about 0.1 to 5 wt. % of a cationic photoinitiator of (c).

7. The process of claim 1 wherein said vinyl ether oligomers of (a) are derived from a urethane obtained by reacting (i) an hydroxyl terminated polyester having the formula

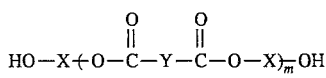

where X and Y are divalent radicals each having a molecular weight of 28 to about 500 and selected from the group consisting of alkylene, arylene, aralkylene, and cycloalkylene radicals m has an average value of 1 to about 100; and (ii) a diisocyanate having the formula

OCN—Q—NCO where Q is a divalent radical selected from the group consisting of alkylene, arylene, aralkylene, and cycloalkylene radicals
or a polyisocyanate having a functionality greater than 2;

and (iii) a hydroxy monovinyl ether having the formula

R'CH=CR"O—Z—OH where
R' and R" are mono valent radicals selected from the group consisting of H and alkyl groups having 1–10 carbon atoms
Z is a divalent radical having a molecular weight of 28 to about 250 and selected from the group consisting of alkylene, cycloalkylene, or poly(alkylene ether) radicals.

8. The process of claim 1 wherein said vinyl ether oligomers of (a) are derived from a urethane obtained by reacting (i) an hydroxyl terminated polyether having the formula HO—X—(—O—X)$_m$—OH where
m has an average value of 1 to about 100
X is a divalent radical having a molecular weight of 28 to about 500 and selected from the group consisting of alkylene, arylene, aralkylene, and cycloalkylene radicals;

and (ii) a diisocyanate having the formula

OCN—Q—NCO where Q is a divalent radical selected from the group consisting of alkylene, arylene, aralkylene, and cycloalkylene radicals or a polyisocyanate having a functionality greater than 2;

and (iii) a hydroxy monovinyl ether having the formula

R'CH=CR"O—Z—OH where
R' and R" are mono valent radicals selected from the group consisting of H and alkyl groups having 1–10 carbon atoms
Z is a divalent radical having a molecular weight of 28 to about 250 and selected from the group consisting of alkylene, cycloalkylene, or polyalkylene ether radicals.

9. The process of claim 1 wherein said vinyl ether oligomers of (a) are derived from a polyester obtained by reacting (a) a dicarboxylic acid having the formula

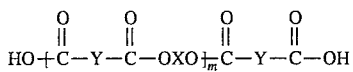

where
X and Y are divalent radicals having a molecular weight of about 28 to 500 and selected from the group consisting of alkylene, arylene, aralkylene, and cycloalkylene radicals
m has an average value of about 1 to 100;

(b) with a hydroxy monovinyl ether having the formula

R'CH=CR"OZOH where
R' and R" are monovalent radicals selected from the group consisting of H and alkyl groups having 1–10 carbon atoms
Z is a divalent radical having a molecular weight of about 28 to 250 and selected from the group consisting of alkylene, cycloalkylene, or polyalkylene ether radicals.

10. The process of claim 1 wherein said vinyl ether oligomers of (a) are derived from a polysiloxane defined as (R'CH=CR"—O—Z—)$_n$—A' where
R', R", and Z are as defined above
N is an integer from 2 to 8
A' is a polysiloxane having n Si—H groups and a molecular weight of 140 to 5,000.

11. The process of claim 1 wherein said vinyl ether oligomers of (a) are derived from a phenol defined as (R'CH=CR"—O—Z—O—)$_n$—A"

A" is a polyvalent aromatic radical having a molecular weight of about 152 to 5,000
R', R" and Z are as defined above
n is 2 to 6.

12. The process of claim 11 wherein Z is ethylene and A' is 4,4'-isopropylidene diphenol.

13. The process of claim 1 wherein said vinyl ether oligomers of (a) are derived from a polyether by reacting at least one of the groups consisting of poly(ethylene oxy), poly (propylene oxy), or poly (butylene oxy) glycols, where m has an average value from about 2 to 50 with acetylene or a vinyl oxy alkyl halide.

14. The process of claim 1 wherein said vinyl ether monomers of (b) are derived from esters and having the formula

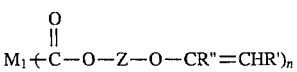

where
n is 1 to 4,
M$_1$ is a mono, di, tri, or tetra functional radical having a molecular weight of 15 to 180 and selected from the group consisting of alkylene, arylene, aralkylene and cycloalkylene radicals, Z is a divalent radical having a molecular weight of 28 to 250 and selected from the group consisting of alkylene, cycloalkylene, or polyalkylene ether radicals, R' and R" are monovalent radicals selected from the group consisting of H and alkyl groups having 1–10 carbon atoms.

15. The process of claim 14 where $M_1$ is a mono, di, tri, or tetra functional radical of benzene.

16. The process of claim 14 wherein Z is the α,α' diradical derived from 1,4-dimethylcyclohexane and $M_1$ is alkylene with 2 to 4 carbon atoms.

17. The process of claim 1 wherein said vinyl ether monomers of (b) are derived from ethers by reacting at least one of the group consisting of poly(ethyleneoxy), poly(propyleneoxy), or poly(butyleneoxy) glycols, where m has an average value from about 1 to about 5 with acetylene or a vinyl oxy alkyl halide.

18. The process of claim 1 wherein said vinyl ether monomers of (b) are derived from aliphatic hydrocarbons described by the formula

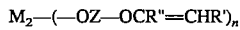

where n is 1 to 4

$M_2$ is a mono, di, tri, or tetra functional aliphatic or cycloaliphatic radical having a molecular weight of about 56 to 500

Z is a divalent radical having a molecular weight of 28 to about 250 and selected from the group consisting of alkylene, cycloalkylene or polyalkylene ether radicals R' and R" are monovalent radicals selected from the group consisting of H and alkyl groups having 1–10 carbon atoms.

19. The process of claim 1 wherein said vinyl ether monomers of (b) are derived from aromatic hydrocarbons described by the formula

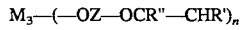

where n is 1 to 4

$M_3$ is a mono, di, tri, or tetrafunctional aromatic radical having a molecular weight of about 77 to 500

Z is a divalent radical having a molecular weight of 28 to about 250 and selected from the group consisting of alkylene, cycloalkylene or polyalkylene ether radicals R' and R" are monovalent radicals selected from the group consisting of H and alkyl groups having 1–10 carbon atoms.

20. The process of claim 1 wherein A is derived from 4,4'-diphenylmethane diisocyanate.

21. The process of claim 1 wherein Z is at least one member of the group consisting of ethylene, butylene, and the α,α' diradical derived from 1,4-dimethylcyclohexane.

22. The process of claim 1 wherein n is 3 or more for said vinyl ether oligomers and/or monomers.

23. The process of claim 1 wherein said cationic photoinitiator is an onium salt of Group V, VI, and VII elements.

24. The process of claim 23 wherein said cationic photoinitiator is based on an iodonium or sulfonium salt.

25. The process of claim 24 wherein said cationic photoinitiator is a triaryl sulfonium salt of hexafluorophosphate or hexafluoroantimony.

26. The process of claim 24 wherein said cationic photoinitiator is

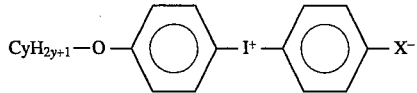

and y is 1 to 18.

27. The process of claim 24 wherein said photoinitiator is

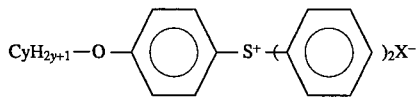

and y is 1 to 18.

28. The process of claim 24 wherein said photoinitiator is at least one member of the group consisting of

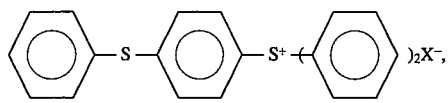

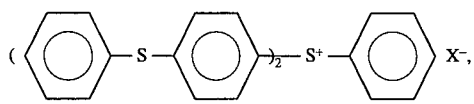

and

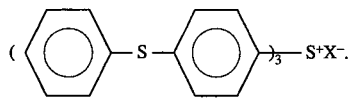

29. The process of claim 26, 27, or 28 wherein $X^-$ is hexafluorophosphate or hexafluoroantimony.

30. The process of claim 24 wherein the photoinitiator is activated by a photosensitizer.

31. The process of claim 1 wherein said actinic light is ultraviolet light produced by a helium/cadmium laser.

32. The process of claim 1 wherein said actinic light is ultraviolet light produced by an argon ion laser.

33. The process of claim 1 wherein said actinic light is visible light produced by an argon ion laser.

34. The process of claim 1 wherein said three-dimensional object is postcured.

35. The process of claim 34 wherein said postcuring is provided by heating.

36. The process of claim 34 wherein said postcuring is provided by ultraviolet or visible light.

* * * * *

UNITED STATES PATENT AND TRADEMARK OFFICE
CERTIFICATE OF CORRECTION

PATENT NO. : 5,506,087
DATED : April 9, 1996
INVENTOR(S) : Stephen C. Lapin and Richard J. Brautigam It is certified that error appears in the above-identified patent and that said Letters Patent is hereby corrected as shown below:

On the title page, after item [73], insert the following:
--[*] Notice: The term of this patent shall not extend beyond the expiration date of Pat. No.: 5,437,964.--

Title page  Other Publications  "Termianted" should read --Terminated--
Column 7, line 60: "(R'CH=CR"—O—Z—)$_n$—O—A" " should read
-- (R'CH=CR"—O—Z—O—)$_n$—A" --
Column 10, line 12: "or PF$_6^-$" should read --or PF$_6^-$ --
Column 10, line 64: "($M_n$=500" should read -- ($\overline{M}_n$=500 --
Column 12, line 21: "(R'CH=CR'—OZ)$_n$—A " should read
--(R'CH=CR"—OZ)$_n$—A --
Column 14, line 45: "n is2to6." should read -- n is 2 to 6. --

Signed and Sealed this

Ninth Day of July, 1996

Attest:

BRUCE LEHMAN

Attesting Officer     Commissioner of Patents and Trademarks